United States Patent
Saado et al.

(10) Patent No.: US 7,046,066 B2
(45) Date of Patent: May 16, 2006

(54) METHOD AND/OR APPARATUS FOR GENERATING A WRITE GATED CLOCK SIGNAL

(75) Inventors: Alon Saado, San Diego, CA (US); Linley M. Young, San Diego, CA (US); Muhammad Afsar, San Diego, CA (US)

(73) Assignee: Via Telecom Co., Ltd., San Diego, CA (US)

( * ) Notice: Subject to any disclaimer, the term of this patent is extended or adjusted under 35 U.S.C. 154(b) by 0 days.

(21) Appl. No.: 10/867,899

(22) Filed: Jun. 15, 2004

(65) Prior Publication Data

US 2005/0275441 A1    Dec. 15, 2005

(51) Int. Cl.
*G06F 1/04* (2006.01)

(52) U.S. Cl. ........................................ 327/291; 327/293

(58) Field of Classification Search ................ 327/291, 327/293, 294, 296, 297, 298, 299; 365/221
See application file for complete search history.

(56) References Cited

U.S. PATENT DOCUMENTS

| 5,987,244 A | 11/1999 | Kau et al. ................... 395/555 |
| 6,278,654 B1 * | 8/2001 | Roohparvar ............. 365/238.5 |
| 6,463,000 B1 * | 10/2002 | Lee et al. ................... 365/221 |

* cited by examiner

*Primary Examiner*—Linh My Nguyen
(74) *Attorney, Agent, or Firm*—Christopher P. Maiorana, PC

(57) ABSTRACT

An apparatus comprising a first circuit and a second circuit. The first circuit may be configured to generate a gated clock signal in response to (i) a write enable signal and (ii) a system clock signal. The gated clock signal is pulsed active while the write enable signal is active. The second circuit may be configured to generate the write enable signal.

19 Claims, 4 Drawing Sheets

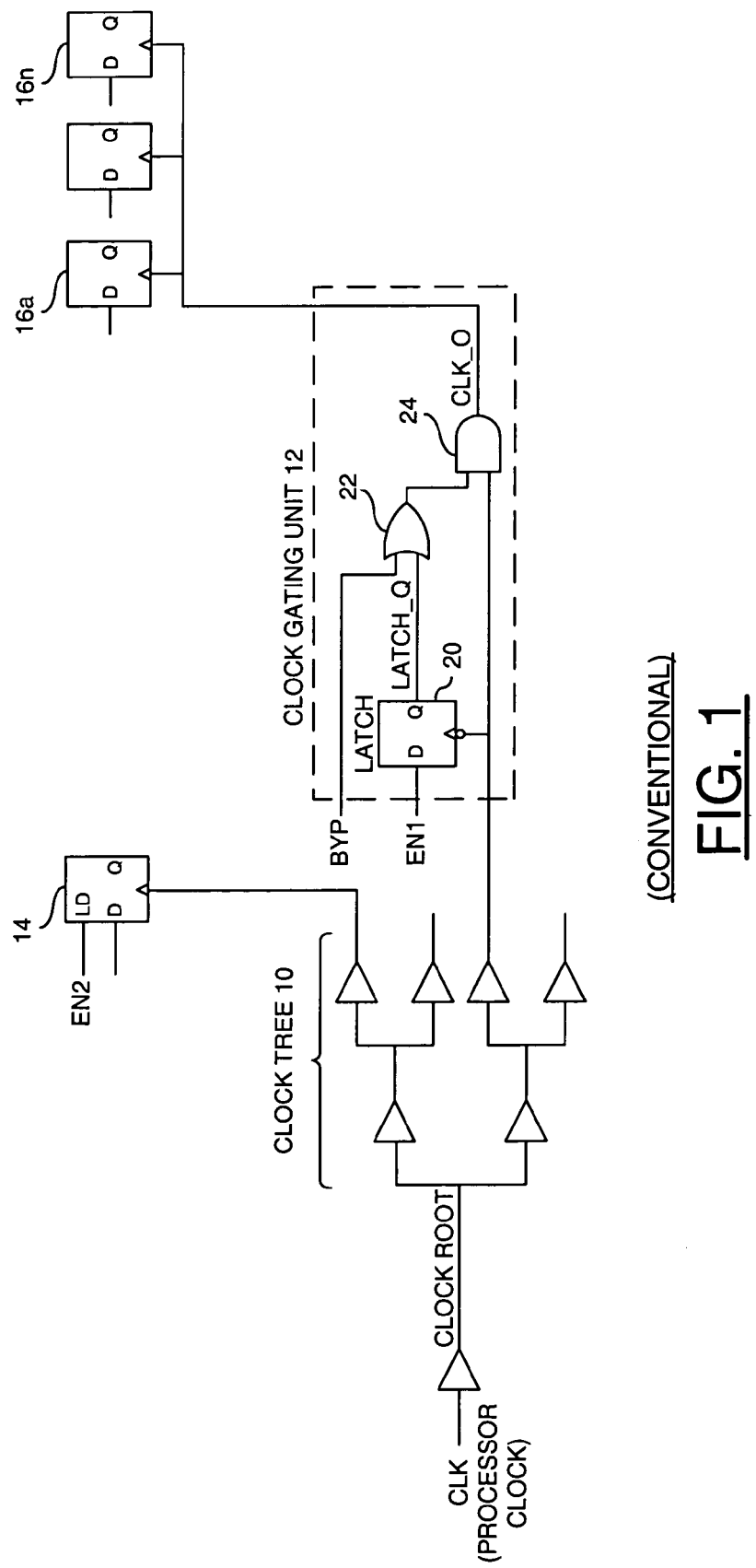
FIG. 1
(CONVENTIONAL)

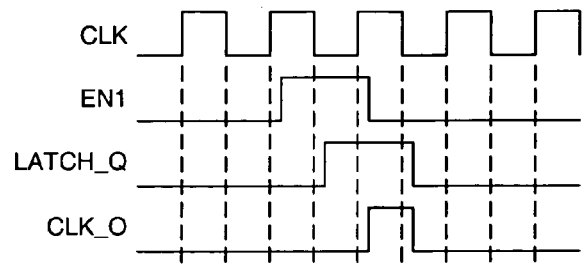
(CONVENTIONAL)
FIG. 2

METHOD AND/OR APPARATUS FOR GENERATING A WRITE GATED CLOCK SIGNAL

FIELD OF THE INVENTION

The present invention relates to clock signals generally and, more particularly, to a method and/or circuit for implementing a write gated clock signal.

BACKGROUND OF THE INVENTION

Conventional systems implement a free-running clock supplied to a number of storage elements. When an enable signal is asserted, new data is captured at the edge of the clock. If a free-running clock is used as a clock of a storage element, the storage element consumes power at every clock edge, even if the other inputs are inactive or unchanged.

Other conventional systems use local clock gating units to lower the power consumption. In such a system, when the enable signal is asserted, a clock gating unit generates a single pulse to capture the new data.

Referring to FIG. 1, a conventional clock network containing a clock tree 10 is shown. The clock network comprises the clock tree 10, a clock gating unit 12, a flip-flop 14, and a number of flip-flops 16a–16n. A number of clock gating units 12 can be implemented on various branches of the clock tree 10. The clock gating unit 12 is shown having a latch 20, an OR gate 22 and an AND gate 24. Some branches may drive single flip-flops. Other branches may go to clock gating units 12, each of which drives a bank of flip-flops (i.e., the flip-flops 16a–16n). The clock input of the flip flops 16a–16n is shown disconnected from a free-running clock signal CLK. An output of the clock gating unit 12 supplies a clock edge when the enable signal EN1 is asserted. Since the clock gating unit 12 contains a few gates and consumes area, it is typically used only for a bank of registers (or flip-flops) which have a common enable signal.

Referring to FIG. 2, a timing diagram of the clock gating unit 12 is shown. When the enable signal EN1 is asserted, the clock gating unit 12 is latched. The output signal LATCH_Q of the latch 20 is gated with the clock, and a single pulse is generated. The single pulse is presented to the clock input of the flip-flops 16a–16n in order to capture the data on the inputs.

Using the clock gating unit 12 for localized clock gating to a number of banks of registers lowers the overall power consumption. However, such an implementation has a number of disadvantages. The clock tree 10 contains one or more levels of buffers to divide the load and reduce the clock skew. The nets (wires) from the clock root to the clock gating units toggles at the frequency of the free-running clock signal CLK and therefore consumes power.

Implementing one or more clock gating units 12 also consumes more area than an implementation without the gating units. During scan test mode, a few nets in the unit cannot be tested to detect manufacturing defects. As shown in FIG. 1, the signal BYP is asserted during scan mode to bypass clock gating. The net that is driven by the latch signal LATCH_Q cannot be tested, because manufacturing defects on that net cannot be observed. The inability to test those nets lowers the test coverage. Additional production tests may be added to cover those nets, but this increases the test time on the tester and increases the manufacturing cost.

Since additional logic is needed to gate the clock signal CLK, such a method is used for banks of registers where the registers in each bank share the same enable signal. An area/power tradeoff decision must be made. If a fewer number of flip-flops than a defined threshold have the same enable, such flip-flops are clocked by the free running clock signal CLK, and consume power even if the data is not changed. The clock skew balancing for clock nets that contain clock gating units is more complicated, and generally needs more levels of buffering.

SUMMARY OF THE INVENTION

The present invention concerns an apparatus comprising a first circuit and a second circuit. The first circuit may be configured to generate a gated clock signal in response to (i) a write enable signal and (ii) a system clock signal. The gated clock signal is pulsed active while the write enable signal is active. The second circuit may be configured to generate the write enable signal.

The objects, features and advantages of the present invention include providing a method and/or circuit that may (i) generate a write gated clock signal (ii) reduce power consumption by presenting a clock edge during a write operation to one or more storage elements, (iii) implement a static clock network when there is not a write operation, (iv) implement writable flip flops in a processor peripheral that uses the write gated clock signal, (v) implement writable flip-flops that are not clocked by a free-running clock, (vi) reduce the implementation area by avoiding use of local clock gating units, (vii) reduce untestable nets in the design, and/or (viii) simplify the clock skew balancing to reduce the number of levels in the clock tree.

BRIEF DESCRIPTION OF THE DRAWINGS

These and other objects, features and advantages of the present invention will be apparent from the following detailed description and the appended claims and drawings in which:

FIG. 1 is a diagram of a conventional clock network and clock gating unit;

FIG. 2 is a timing diagram of a conventional clock gating unit;

DETAILED DESCRIPTION OF THE PREFERRED EMBODIMENTS

A storage element consumes power when the clock input is active even if there is no change to the input data. Supplying a clock edge during a write to the storage element while an enable signal is asserted saves power. The present invention may be used to generate a write gated clock signal (e.g., WG_CLK) that may be used for write operations. The write gated clock signal WG_CLK maximizes power savings and is more efficient than conventional clock gating methods.

The write gated clock signal WG_CLK may be used to clock the storage elements in a number of peripherals. The write gated clock signal WG_CLK may be generated in response to a write enable signal (e.g., WE) of a processor (or other circuit). The write gated clock signal WG_CLK may be generated in further response to signals on an address bus and/or other control signals from the processor. The write gated clock signal WG_CLK is typically active at the end of a write cycle.

Figure 3:
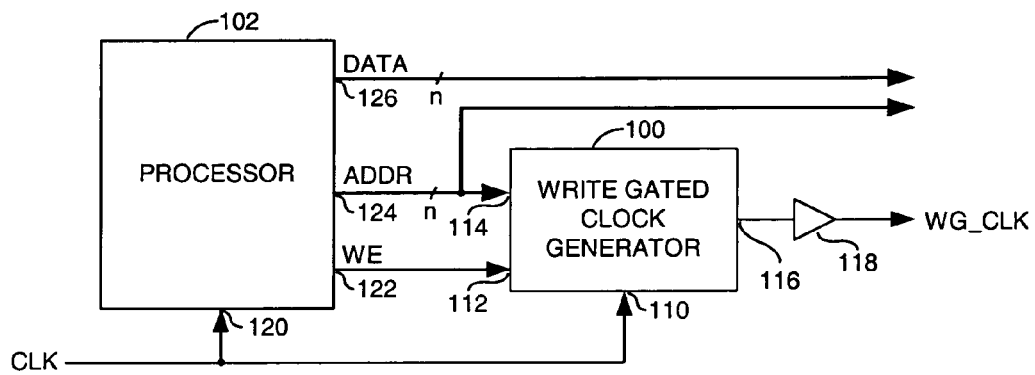
FIG. 3 is a diagram of a write gated clock generator in accordance with the present invention.

Referring to FIG. 3, an example of a write gated clock generator 100 of the present invention is shown in the context of a processor 102. The write gated clock generator 100 has an input 110 that may receive a clock signal (e.g., CLK), an input 112 that may receive the write enable signal WE and an input 114 that may receive one or more address signals (e.g., ADDR). The clock signal CLK may be a free-running processor clock signal. The write gated clock generator 100 may also have an output 116 that may present the write gated clock signal WG_CLK. A buffer 118 may be implemented between the write gated clock generator 100 and the write gated clock signal WG_CLK. The write gated clock signal WG_CLK may be considered a root clock signal. The processor 102 may have an input 120 that receives the signal CLK, an output 122 that presents the signal WE, an output 124 that presents the signal ADDR, and an output 126 that presents a signal DATA.

The signal WG_CLK may be generated using a finite state machine with N states, where N is an integer (to be described in more detail in connection with FIG. 6). For example, the signal WG_CLK may be generated by a small state machine with 3 states. In general, the particular implementation depends on the length of the write cycle and the waveform of the write gated clock signal WG_CLK (i.e., width of the pulse and the active and inactive state of the write gated clock signal WG_CLK). If the write cycle is short (e.g., 1 or 2 cycles) usually several gates are needed. If the write cycle is longer (e.g., more than 2 cycles), the easiest implementation will be a state machine. However, a gate implementation may be easier in certain implementations.

Figure 4:
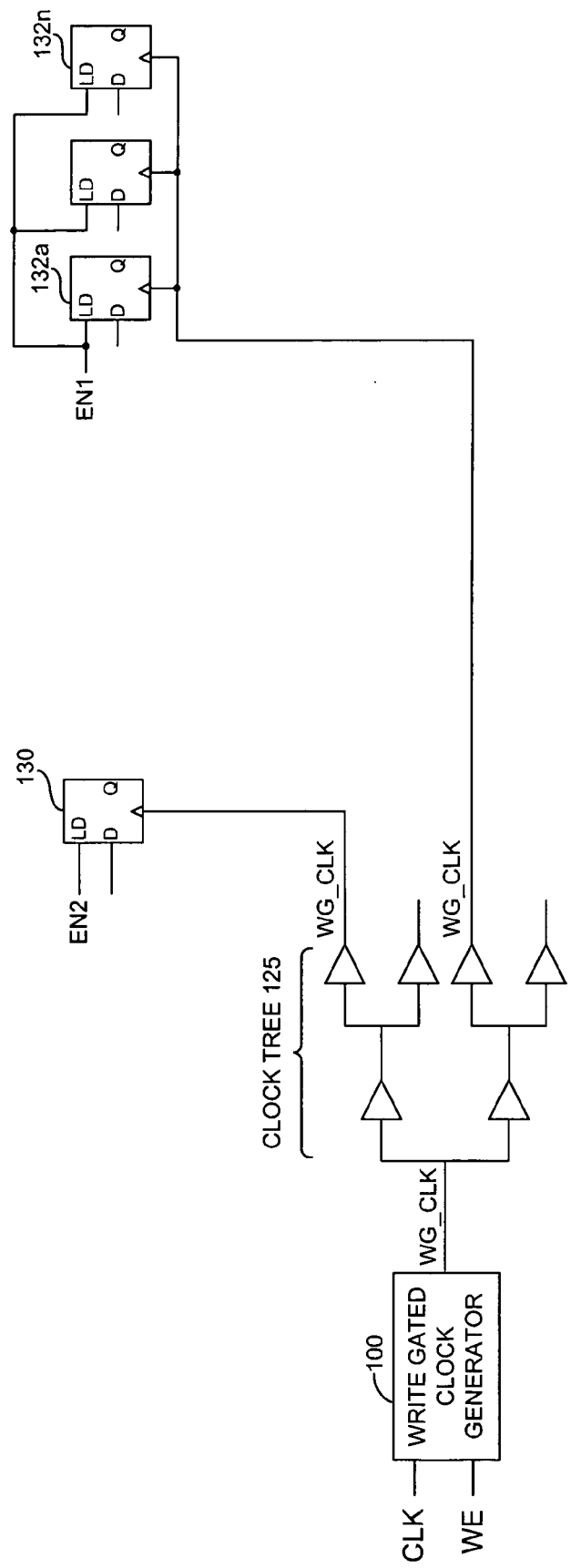
FIG. 4 is a diagram of a clock network and write gated clock.

Referring to FIG. 4, the present invention is shown in the context of a clock tree network 125, a writable storage element 130 and a plurality of writable storage elements 132a–132n. The write gated clock signal WG_CLK is shown being presented to the writable storage element 130 and the writable storage elements 132a–132n. Since the write gated clock signal WG_CLK is generated at the root of the clock tree 125, additional local clock gating units are not generally needed. The writable storage elements 130 and 132a–132n may be implemented as latches, flip-flops or other types of storage elements.

When local clock gating units are not implemented, all of the flip-flops 132a–132n clocked by the write gated clock signal WG_CLK will consume power when the write gated clock signal WG_CLK is active, even if a particular one of the flip-flops 132a–132n is not enabled. However, since the ratio between the frequency of the average write gated clock signal WG_CLK and the frequency of the free-running processor clock signal CLK is typically very small (e.g., preferably 1% to 25%, more preferably 1% to 10%, or in the general range of 5%), the power consumed in the write gated flip-flops 130 and 132a–132n is negligible compared with conventional approaches. The ratio between the frequency of the clock signal CLK and the frequency of the write gated clock signal WG_CLK depends on the number of write operations that a particular processor executes and the number of wait states (e.g., the width of the write cycle). However, local clock gating units may be used in addition to the write gated clock unit 100 in order to maximize power savings in particular design implementations. Such an additional implementation may add to the expense of area and clock balancing complexity.

Figure 5:
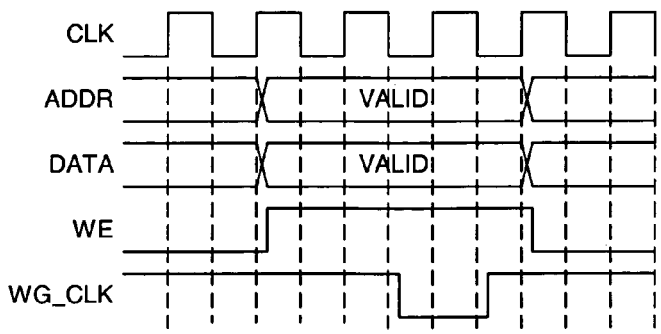
FIG. 5 is a timing diagram of the write gated clock signal and other signals of FIG. 3.

Referring to FIG. 5, a timing diagram of the write gated clock signal WG_CLK relative to other signals received from the processor 102 is shown. The processor 102 is generally clocked by the clock signal CLK. The write gated clock signal WG_CLK normally pulses either high or low during a write transaction. When the processor 102 writes to one of a number of peripherals (e.g., the flip-flops 130 or 132a–132n), the processor 102 supplies the address signal ADDR and the data signal DATA, and asserts the write enable signal WE. The signals ADDR, DATA and WE may be valid during the entire write transaction. A particular write transaction may encompass a single cycle or multiple cycles. At the end of the write transaction, the write gated clock signal WG_CLK may be pulsed to generate an active clock edge. A single active edge is supplied by the write gated clock generator 100. The active edge of the write gated clock signal WG_CLK may occur during any cycle of a multi-cycle write transaction. However, the last cycle is typically chosen in order to maximize the time allowed for data to propagate from the processor 102 to the writable flip-flops 130 and 132a–132n. If the enable signal of a flip-flop (e.g., EN2) or bank of flip-flops (e.g., EN1) is asserted, the data is captured.

Figure 6:
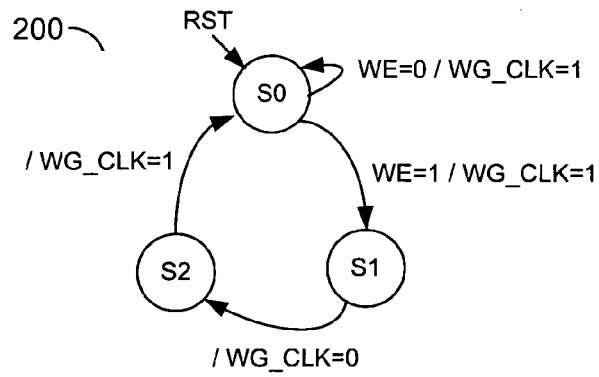
FIG. 6 is an example of the write gated clock generator implemented as a state machine.

Referring to FIG. 6, a diagram of a state machine 200 is shown. The state machine 200 is an example of an implementation of the write gated clock generator 100. The state machine 200 generally comprises a state S0, a state S1 and a state S2. After a reset, the state machine 200 starts in the state S0. The reset may be initiated by a reset signal (e.g., RST). The state machine 200 may be configured to operate on the falling edge of the signal CLK. However, a positive edge triggered state machine 200 may be implemented to meet the design criteria of a particular implementation. Each state is shown illustrating states of the signal WE as an input and states of the signal WG_CLK as an output. While in the state S0, as long as the signal WE continues to be equal to 0, the state machine 200 stays in the state S0 and the signal WG_CLK continues to be equal to 1. Once the signal WE transitions to a 1, the state machine 200 moves to the state S1 and the signal WG_CLK continues to be equal to 1. Next, the state machine 200 moves to the state S2 regardless of the state of the signal WE. In general, not showing a state of the signal WE indicates a "don't care" condition. The signal WG_CLK transitions to 0 when the state machine moves to the state S2. Next, the signal WG_CLK transitions back to 1 and the state machine 200 moves back to the state S0.

Figure 7:
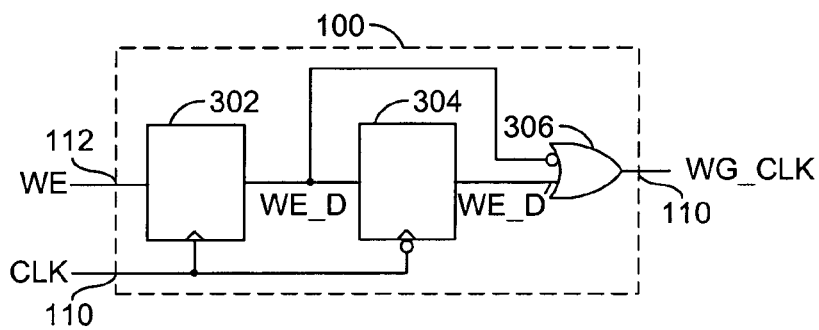
FIG. 7 is a circuit diagram illustrating an implementation of the write gated clock generator.

Referring to FIG. 7, another example of a circuit implementation of the write gated clock generator 100 is shown. The circuit 100 generally comprises a flip-flop 302, a flip-flop 304 and a gate 306. The flip-flops 302 and 304 may be implemented as D-type flip-flops, T-type flip-flops or other flip-flops and/or register circuits configured to meet the design criteria of a particular implementation. The flip-flop 302 receives the signal CLK. The flip-flop 304 receives an inverted version of the signal CLK as indicated by the bubble in the clock input to the flip-flop 304. The flip-flop 302 generates a signal WE_D in response to the signal WE. The signal WE_D is generally delayed from the signal WE. The signal WE_D is presented to the flip-flop 304 and to an input of the gate 306. The flip-flop 304 presents a signal (e.g., WE_D') to an input of the gate 306 in response to the signal WE_D. The gate 306 presents the signal WG_CLK in response to the signal WE_D and the signal WE_D'. The gate 306 is shown implemented as an OR gate with an inverted input that receives the signal WE_D. However, other gates and/or gate combinations may be implemented to meet the design criteria of a particular implementation.

Figure 8:
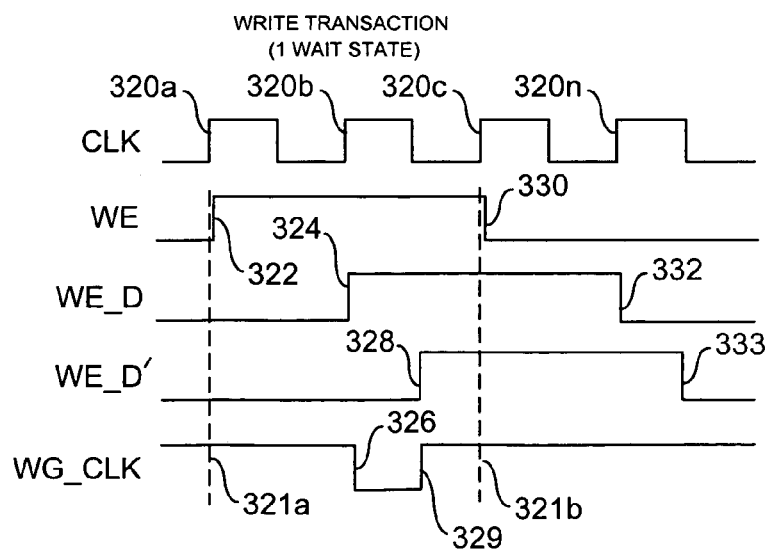
FIG. 8 is a timing diagram of the various signals of FIG. 7.

Referring to FIG. 8, a timing diagram of the various signals of FIG. 7 are shown. The signal CLK is shown having a number of positive transitions 320a–320n. A write transaction is shown occurring between the transition 320a and the transition 320b as indicated by the vertical dotted lines 321a and 321b. After the positive transition 320a, the signal WE has a positive transition 322. The signal WE_D has a positive transition 324 that responds to the transition 320b. The signal WG_CLK has a negative transition 326 that responds to the positive transition 324. The signal WE_D' has a positive transition 328 on the next falling edge of the clock signal CLK after the positive transition 320b. The signal WG_CLK has a positive transition 329 that responds to the positive transition 328. After the signal CLK has a positive transition 320c, the signal WE has a negative transition 330. The next transition occurs when the signal WE_D has a negative transition 332, which occurs on the positive transition of 320n of the signal CLK. The signal WE_D' has a negative transition 333 one half of a clock cycle after the negative transition 332.

The present invention reduces the power consumption by pulsing a clock edge during a write operation to the storage elements 130 and 132a–132n. When there is no write operation, the clock tree 125 is static. Therefore the clock tree units (i.e., buffers and/or inverters) do not consume power. All of the writable flip flops 130 and 132a–132n in the peripheral of the processor 102 normally receive the write gated clock signal WG_CLK.

The particular number of flip-flops 130 and 132a–132n may be varied to meet the design criteria of a particular implementation. For example, a number of individual flip-flops may be implemented, each similar to the flip-flop 130. A number of flip-flop banks may be implemented, each similar to the flip-flops 132a–132n. A single clock signal WG_CLK may be implemented to drive all of the flip-flop banks and/or individual flip-flops. In general, there are no writable flip-flops that are clocked by a free-running clock signal CLK. The implementation of the present invention generally reduces the area needed to implement a chip by avoiding use of local clock gating units described in the background section. The present invention also reduces untestable nets in the design. The present invention may also simplify the clock skew balancing and reduce the number of levels in the clock tree.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

In one example, the present invention may be used in a CDMA2000 mobile communication system. However, the present invention may be easily implemented in other designs.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
a first circuit configured to generate a gated clock signal in response to (i) a write enable signal and (ii) a system clock signal, wherein said gated clock signal is pulsed active while said write enable signal is active;
a second circuit configured to generate said write enable signal; and
a clock tree configured to distribute a plurality of said gated clock signals.

2. The apparatus according to claim 1, wherein said gated clock signal is pulsed not more than once per write cycle.

3. The apparatus according to claim 1, wherein said first circuit comprises a write gated clock generator circuit comprising a plurality of storage elements and a logic gate.

4. The apparatus according to claim 1, wherein said second circuit comprises a processor.

5. The apparatus according to claim 1, wherein a first of said plurality of gated clock signals is presented to a first storage element.

6. The apparatus according to claim 5, wherein said first storage element is configured to receive a first enable signal.

7. The apparatus according to claim 6, wherein a second of said plurality of gated clock signals is presented to a second storage element.

8. The apparatus according to claim 7, wherein said second storage element is configured to receive a second enable signal.

9. The apparatus according to claim 8, wherein said second enable signal and said second of said plurality of gated clock signals is presented to a plurality of second storage elements.

10. The apparatus according to claim 1, wherein said gated clock signal comprises a write gated clock signal.

11. The apparatus according to claim 2, wherein said gated clock signal reduces power consumption by not being pulsed more than once per write cycle.

12. An apparatus comprising:
means for generating a gated clock signal in response to (i) a write enable signal and (ii) a system clock signal, wherein said gated clock signal is pulsed active while said write enable signal is active;
means for generating said write enable signal; and
means for implementing a clock tree for presenting a plurality of said gated clock signals.

13. The apparatus according to claim 12, wherein said gated clock signal is pulsed not more than once per write cycle.

14. A method for generating a gated clock signal comprising the steps of:
(A) generating a write enable signal;
(B) generating a gated clock signal in response to (i) said write enable signal and (ii) a system clock signal, wherein said gated clock signal is pulsed active while said write enable signal is active; and
(C) implementing a clock tree for presenting a plurality of said gated clock signals.

15. The method according to claim 14, wherein said gated clock signal is pulsed not more than once per write cycle.

16. The apparatus according to claim 13, wherein said gated clock signal reduces power consumption by not being pulsed more than once per write cycle.

17. The method according to claim 15, wherein said gated clock signal reduces power consumption by not being pulsed more than once per write cycle.

18. The apparatus according to claim 1, wherein said gated clock signal reduces power consumption.

19. The apparatus according to claim 12, wherein said gated clock signal reduces power consumption.

* * * * *